United States Patent
Wang (10) Patent No.: US 8,415,735 B2
(45) Date of Patent: Apr. 9, 2013

(54) DUAL CONDUCTING FLOATING SPACER METAL OXIDE SEMICONDUCTOR FIELD EFFECT TRANSISTOR (DCFS MOSFET) AND METHOD TO FABRICATE THE SAME

(75) Inventor: Lee Wang, Diamond Bar, CA (US)

(73) Assignee: FlashSilicon, Inc., Diamond Bar, CA (US)

( * ) Notice: Subject to any disclaimer, the term of this patent is extended or adjusted under 35 U.S.C. 154(b) by 681 days.

(21) Appl. No.: 12/614,265

(22) Filed: Nov. 6, 2009

(65) Prior Publication Data

US 2011/0108904 A1    May 12, 2011

(51) Int. Cl.
*H01L 29/788* (2006.01)

(52) U.S. Cl. .................................. 257/316; 257/E29.3

(58) Field of Classification Search .................. 257/316, 257/E29.3, E29.308
See application file for complete search history.

(56) References Cited

U.S. PATENT DOCUMENTS

| | | | |
|---|---|---|---|
| 6,093,945 A | 7/2000 | Yang | |
| 6,103,573 A * | 8/2000 | Harari et al. | 438/257 |
| 2002/0020992 A1* | 2/2002 | Kanuma | 280/730.2 |
| 2002/0130356 A1 | 9/2002 | Sung et al. | |
| 2002/0153555 A1 | 10/2002 | Manabe et al. | |
| 2005/0162884 A1 | 7/2005 | Jung | |
| 2006/0267075 A1* | 11/2006 | Sandhu et al. | 257/316 |
| 2009/0140324 A1 | 6/2009 | Park | |

FOREIGN PATENT DOCUMENTS

KR    10-2005-0069136    7/2005

OTHER PUBLICATIONS

PCT International Search Report for International Application No. PCT/US2010/055605 dated May 31, 2011, 3 pages.
PCT Written Opinion of the International Searching Authority for International Application No. PCT/US2010/055605 dated May 31, 2011, 4 pages.

* cited by examiner

*Primary Examiner* — Zandra Smith
*Assistant Examiner* — Paul Patton
(74) *Attorney, Agent, or Firm* — Edward C. Kwok; Hogan Lovells US LLP (57) ABSTRACT

Dual Conducting Floating Spacer Metal Oxide Semiconductor Field Effect Transistors (DCFS MOSFETs) and methods for fabricate them using a process that is compatible with forming conventional MOSFETs are disclosed. A DCFS MOSFET can provide multi-bit storage in a single Non-Volatile Memory (NVM) memory cell. Like a typical MOSFET, a DCFS MOSFET includes a control gate electrode on top of a gate dielectric-silicon substrate, thereby forming a main channel of the device. Two electrically isolated conductor spacers are provided on both sides of the control gate and partially overlap two source/drain diffusion areas, which are doped to an opposite type to the conductivity type of the substrate semiconductor. The DCFS MOSFET becomes conducting when a voltage that exceeds a threshold is applied at the control gate and is coupled through the corresponding conducting floating spacer to generate an electrical field strong enough to invert the carriers near the source junction. By storing charge in the two independent conducting floating spacers, DCFS MOSFET can have two independent sets of threshold voltages associated with the source junctions.

6 Claims, 14 Drawing Sheets

N-channel Device Schematic

*FIG. 5a*

P-channel Device Schematic

DUAL CONDUCTING FLOATING SPACER METAL OXIDE SEMICONDUCTOR FIELD EFFECT TRANSISTOR (DCFS MOSFET) AND METHOD TO FABRICATE THE SAME

BACKGROUND OF THE INVENTION

1. Field of the Invention

The present invention relates to semiconductor devices. More specifically, the present invention relates to fabricating Dual Conducting Floating Spacer Metal-Oxide-Semiconductor Field Effect Transistors (DCFS MOSFETs) using a process that is compatible with manufacturing conventional MOSFETs on the same wafer.

2. Discussion of the Related Art

Semiconductor non-volatile memory (NVM) and, particularly, electrically-erasable, programmable read-only memories (EEPROMs) are used in a wide range of electronic equipment (e.g., computers, telecommunications hardware and consumer appliances). In general, EEPROMs are often used to store firmware and data, as the content is maintained even with power off and may be altered as needed. The flash EEPROM may be regarded as a specially configured EEPROM that may be erased only on a global or sector-by-sector basis. The application of flash memory as a mass code and data storage device has placed additional demands on reduction of its cost-per-bit and increase in the required total memory density. In conventional NVMs, a one-to-one relationship exists between memory density and number of memory cells. The ability to store more that one bit in a single NVM cell is important for cost per bit reduction.

Single cell multi-bit NVM devices are known in the art. Most multi-bit NVM devices utilize multi-level thresholds to store more than one bit per memory cell, with each threshold level representing a different state. For example, a memory cell having four threshold levels can store two bits of information. Others physically store charge in separated regions of the NVM device. For examples, U.S. Pat. No. 5,021,999, issued to Kohda et al., teaches a non-volatile memory cell formed by an MOS transistor having a floating gate with two electrically separated segments. The memory cell can store three levels of data: neither segment is charged, charge injected into either one of the two segments, and charge injected into both segments.

As another example, U.S. Pat. No. 6,011,725 issued to Eitan teaches nitride read-only memory (NROM), which stores charge in nitride traps located respectively near the left and right regions of the memory cell. The left bit is read in the same manner as the right bit, except that the source and drain electrodes are reversed. Although the NROM-type NVM devices (MirrorBit™, available from Spansion) have been in production, the challenges of controlling nitride film properties and scaling down device geometry still remain. One challenge is to fill and to remove charge from inhomogeneous nitride traps in well-controlled areas above the device channel region. However, conventional programming methods, such as hot carrier injection (HCI), Fowler-Nordheim tunneling, and band-to-band tunneling cannot inject carriers into the nitride trap areas as precisely as desired because of programming non-uniformity and device inhomogeneity. Such non-uniformity can lead to a wider threshold voltage distribution and mutual threshold voltage interference between the source and drain terminals during programming. Furthermore, erasing charge from a charge-trap type NVM device requires removing electrons from the trap sites, or neutralizing them by injecting holes into the trap sites.

To remove stored electrons from the nitride traps using the Fowler-Nordheim tunneling mechanism requires a long erasing time and a relatively thinner, high voltage-limited nitride film, due to the adverse effect of reversed charge injection from the control gate. The charge transport mechanism in a nitride film, known as the Frenkel-Poole emission, is the thermal excitation of trapped charge from an inhomogeneous trap-potential medium. Thus, after erasure by applying a high electrical field to the nitride film, a wide and less controllable residual charge distribution remains. In reading, such a device is known to accumulate charge in its dielectric films, so that the sub-threshold slope of the MOSFET device is degraded, thereby resulting in a larger off-leakage current.

Precise injection of holes into the electron trapped sites is required to neutralize the trapped electrons. However, due to inhomogeneous depths of trap potentials, both electrons and holes may remain in nitride film trap sites even with the same injection point. The residual charge accumulation effect from programming and erase cycles may lead to a severe degradation in an NVM device. These issues of the NROM NVM device is expected to worsen, as the trapped electron area has to increase to achieve a higher threshold voltage shift and the device channel length has to be shortened to scale down the device.

SUMMARY

The present invention provides a Dual Conducting Floating Spacer Metal-Oxide Semiconductor Field Effect Transistor (DCFS MOSFET) which has two floating spacers made of conducting material, surrounded by insulating dielectric materials. The two physically separated and electrically isolated conducting floating spacers store charge in a non-volatile memory (NVM) application. Since the threshold voltage of a MOSFET is determined by carrier inversion near the source junction, the stored charge in the source-side conducting floating spacer can screen the capacitively coupled electrical field between the gate and the source electrode, thereby resulting in a threshold voltage change for the MOSFET. With appropriate the source/drain regions appropriately located, the stored charge on each of the conducting floating spacers can be separately read out by interchanging the device's source and drain electrodes. Thus, for an NVM application, a DCFS MOSFET can provide twice the storage capacity by storing one or more levels of charge in each of its two separate conducting floating spacers. Furthermore, unlike a charge trap material having a distribution of trap potential depths and locations, the conducting floating spacers of a DCFS MOSFET are made of material in a well-defined geometry, thus preserving the good programming and erasing properties of a conventional conducting floating gate device. The DCFS MOSFET of the present invention may be scaled down according to conventional MOSFET scaling rules.

The present invention is better understood upon consideration of the detailed description below in conjunction with the drawings.

BRIEF DESCRIPTION OF THE DRAWINGS

To facilitate cross reference between figures, like reference numerals are assigned to like elements.

DETAILED DESCRIPTION OF THE PREFERRED EMBODIMENTS

Figure 1A:
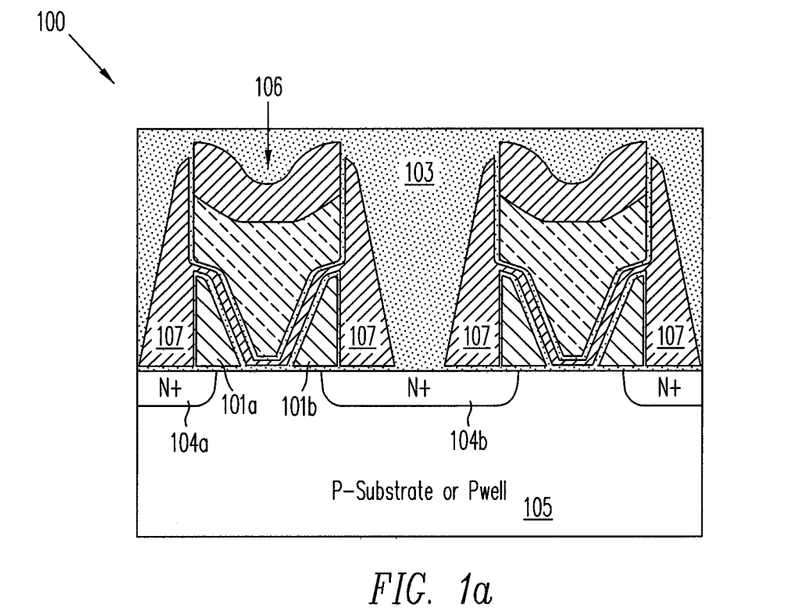
FIGS. 1(a) and 1(b) show cross-sections of dual conducting floating spacer NVM devices, for N-channel and P-channel devices, respectively, in NAND-type flash arrays, according to one embodiment of the present invention.
Figure 1B:
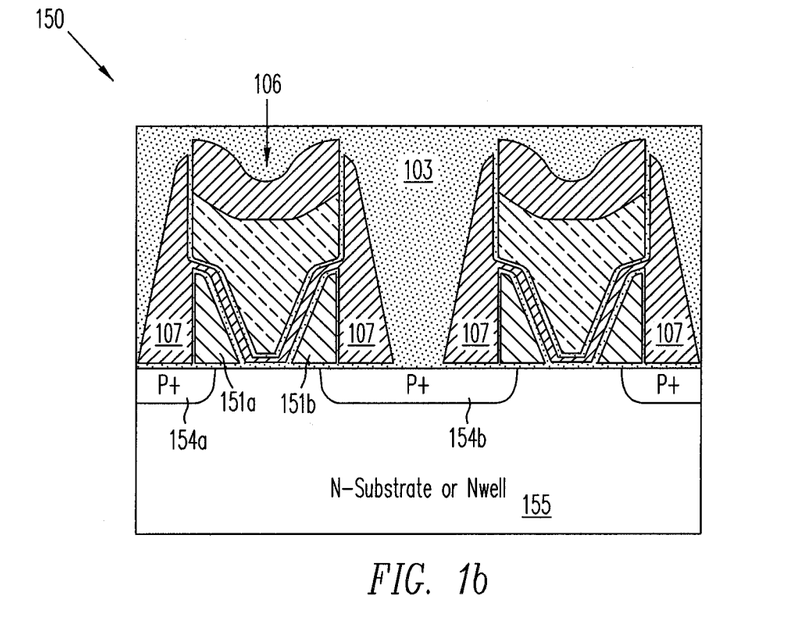
Figure 2:
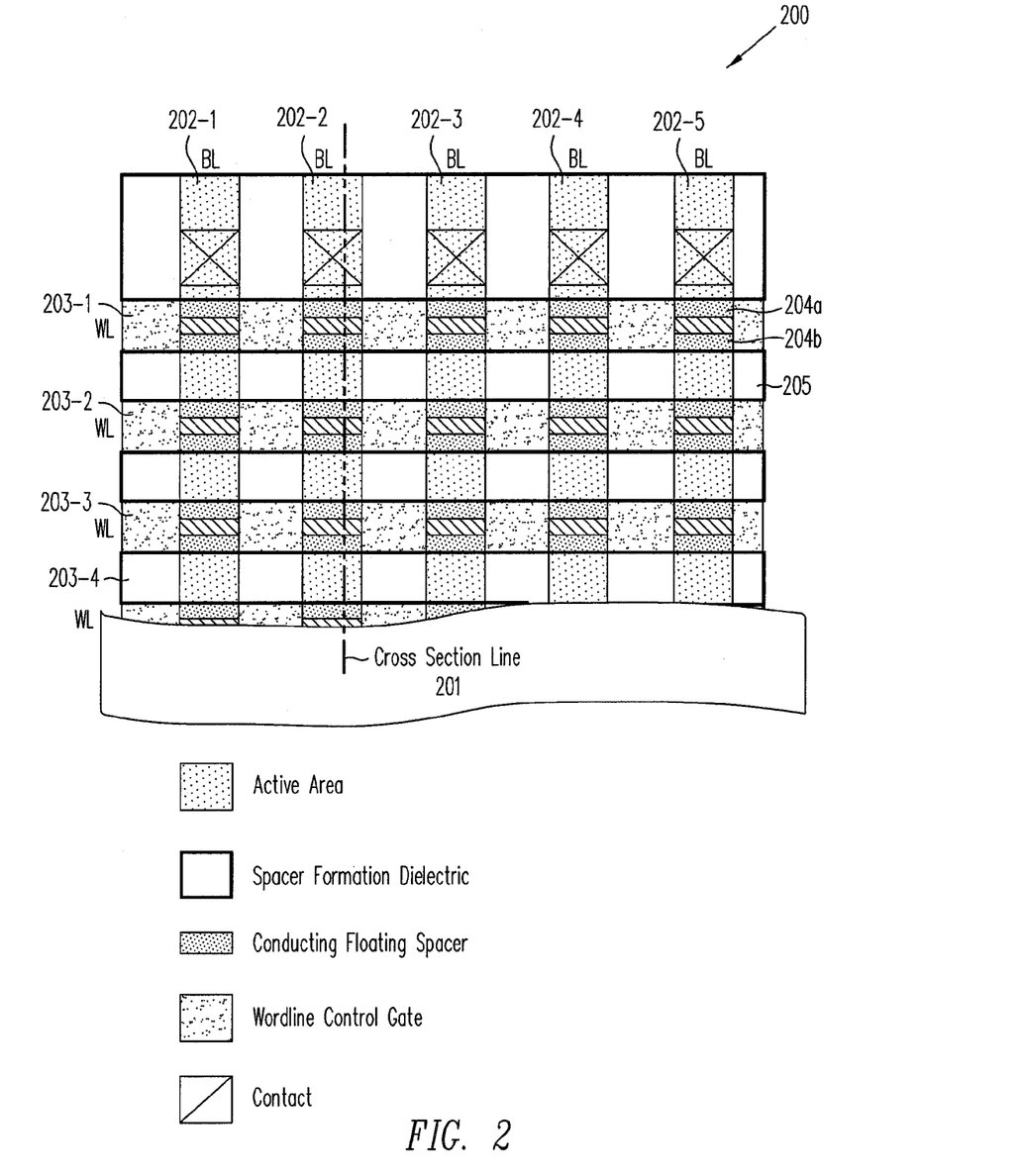
FIG. 2 is a layout view of NAND-type array 200 of DCFS devices, such as those shown in FIG. 1(a) or FIG. 1(b), in accordance with one embodiment of the present invention.

FIGS. 1(a) and 1(b) show cross-sections of dual conducting floating spacer NVM devices, for N-channel and P-channel devices, respectively, in NAND-type flash arrays, according to one embodiment of the present invention. FIG. 2 is a layout view of NAND-type array 200 of DCFS devices, such as those shown in FIG. 1(a) or FIG. 1(b), in accordance with one embodiment of the present invention. The cross-sections of FIG. 1(a) and FIG. 1(b) may be seen from the cross section line 201, depending on whether N-channel or P-channel devices are fabricated.

As shown in FIG. 1(a), conducting floating spacers 101a and 101b are made of conducting material residing on each side of MOSFET 100, surrounded by dielectric material 103. Charge may be stored in each of conducting floating spacers 101a and 101b, which slightly overlap source/drain electrode diffusion regions 104a and 104b on the sides of MOSFET 100. The two junctions located below floating spacers 101a and 101b are formed by heavy doping in source/drain diffusion regions 101a and 101b, relative to the opposite-type impurity in substrate 105. Similarly, in FIG. 1(b), conducting floating spacers 151a and 151b are made of conducting material residing on each side of MOSFET 150, surrounded by dielectric material 103. Charge may be stored in each of conducting floating spacers 151a and 151b, which slightly overlap source/drain electrode diffusion regions 154a and 154b on the sides of MOSFET 100. The two junctions located below conducting floating spacers 151a and 151b are formed by heavy doping in source/drain diffusion regions 151a and 151b, relative to the opposite-type impurity in substrate 155.

As shown in FIG. 2, NAND-type array 200 includes a number of bit lines 202-1 to 202-N running along a first direction (also along diffusion regions) and a number of word lines 203-1 to 203-M (i.e., gate electrodes) running in an orthogonal direction to the first direction. Dual conducting floating spacers (e.g., dual conducting floating spacers 204a and 204b) are shown in FIG. 2 in active areas under word lines 203-1 and 203-M.

During operation, the threshold voltage required for a MOSFET to become conducting is determined by applying a gate voltage to induce a vertical electrical field strong enough to invert the carriers in a channel region into the same carrier type as the carriers in the source electrode. When the channel inversion near the source junction occurs at the threshold voltage, majority carriers are injected into the channel region by a lateral electrical field created by the voltage difference between the source electrode and the drain electrode. Depending on the strength of the lateral field near the drain electrode region (relative to the vertical field), the MOSFET operates either in a linear mode or in a saturation mode.

In the linear mode, the vertical electrical field near the drain surface region is larger than the lateral electrical field, such that the channel surface is fully inverted and a resistive current flows from source electrode to drain electrode. In the saturation mode, however, the lateral electrical field is larger than the vertical field near the drain surface region, such that a surface depletion region is formed between a pinch-off point in the channel surface and the drain electrode. When mobile carriers are injected beyond the pinch-off point into the drain depletion region, hot carriers are generated by impact ionization. Most of hot carriers (i.e., hot electrons and holes) created by the impact ionization in the drain depletion region are collected by the drain electrode and the device substrate.

For an N-type MOSFET, the majority carriers are negative electrons, the applied gate voltage (relative to source electrode) must be higher than the threshold voltage to invert the surface channel of an N-type MOSFET with a positive drain-source voltage, to drive electrons to flow toward the drain electrode. For a P-type MOSFET, the majority carriers are positive holes. The applied gate voltage (relative to the source electrode) must be lower than the threshold voltage to invert the surface channel of a P-type MOSFET with a negative drain-source voltage, to drive holes to flow toward the drain electrode.

In the disclosed DCFS MOSFET device 100 of FIG. 1(a), the source/substrate junction and drain/substrate junction are formed under conducting floating spacers 101a and 101b. DCFS MOSFET 100 becomes conducting when a gate voltage is applied through capacitive coupling of the source-side spacer to invert the surface channel of the source junction to become the same carrier type as the source electrode. The majority carriers are injected into the channel at the threshold voltage. Without charge stored in the source-side floating spacer, the threshold voltage $V_{th}$ is determined by the channel impurity concentration. With stored charge in the conducting floating spacer above the source junction, the threshold voltage is altered by effect of the stored charge screening on the electrical field between the control gate electrode, through the conducting spacer, and the source electrode.

Figure 5A:
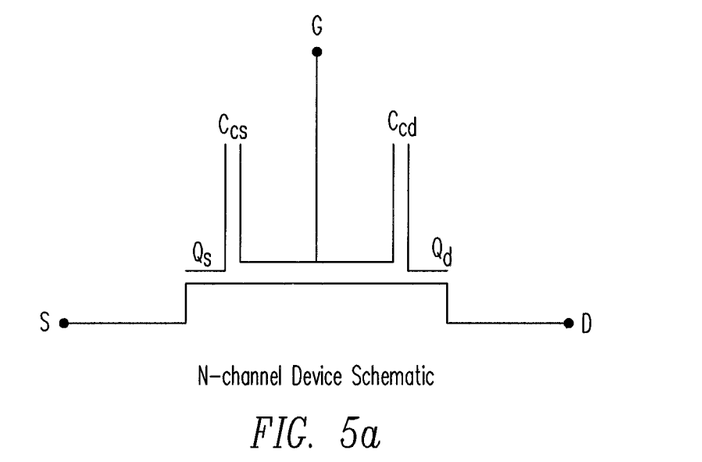
FIGS. 5(a) and 5(b) show, respectively, equivalent device circuit schematics for an N-channel DCFS MOSFET and a P-channel DCFS MOSFET, according to one embodiment of the present invention.
Figure 5B:
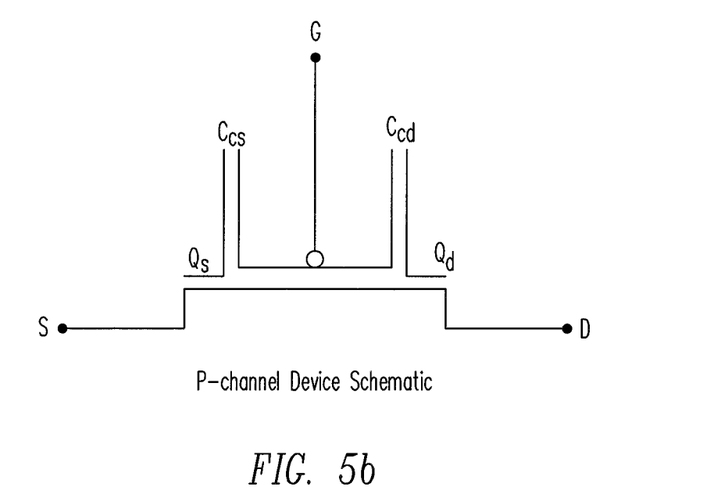

FIGS. 5(a) and 5(b) show, respectively, equivalent device circuit schematics for an N-channel DCFS MOSFET and a P-channel DCFS MOSFET, according to one embodiment of the present invention. The threshold voltage $V_{nvmth}$ of the DCFS MOSFET, when an amount Qs of charge is stored on the source-side floating spacer is given by:

$$V_{nvmth} = V_{th} - \frac{Q_S}{C_C},$$

where $C_C$, is the capacitance between the control gate and the floating spacer near the source electrode, and $V_{th}$ is the threshold voltage when no charge is stored in the same source-side floating spacer. The charge $Q_d$ stored on the drain-side conducting floating spacer and the channel inversion coupled from the control gate affect the turn-on driving current of the linear and saturation mode operations of the DCFS MOSFET. By interchanging the assignments of the diffusion regions to be the source electrode and the drain electrode, the DCFS MOSFET may have two independent sets of threshold voltages, each set being associated with the charge levels stored in one of the independent conducting floating spacers. The number of threshold voltage levels on each conducting spacer of DCFS MOSFET is related to the number of bits that can be stored in that conducting spacer by Number of Bits=$\log_2$ (number of threshold voltage levels). For examples, 16 threshold voltage levels are required to store 4 bits in each conducting spacer of the DCFS MOSFET. Together with the interchange of the source electrode and the drain electrode of the same DCFS MOSFET, the DCFS MOSFET can enhance its bit storage capacity by a factor of 2. For example, if sixteen threshold voltage levels are attained on each side of the DCFS MOSFET, the total bits stored in the DCFS MOSFET is 8 bits.

Figure 3A:
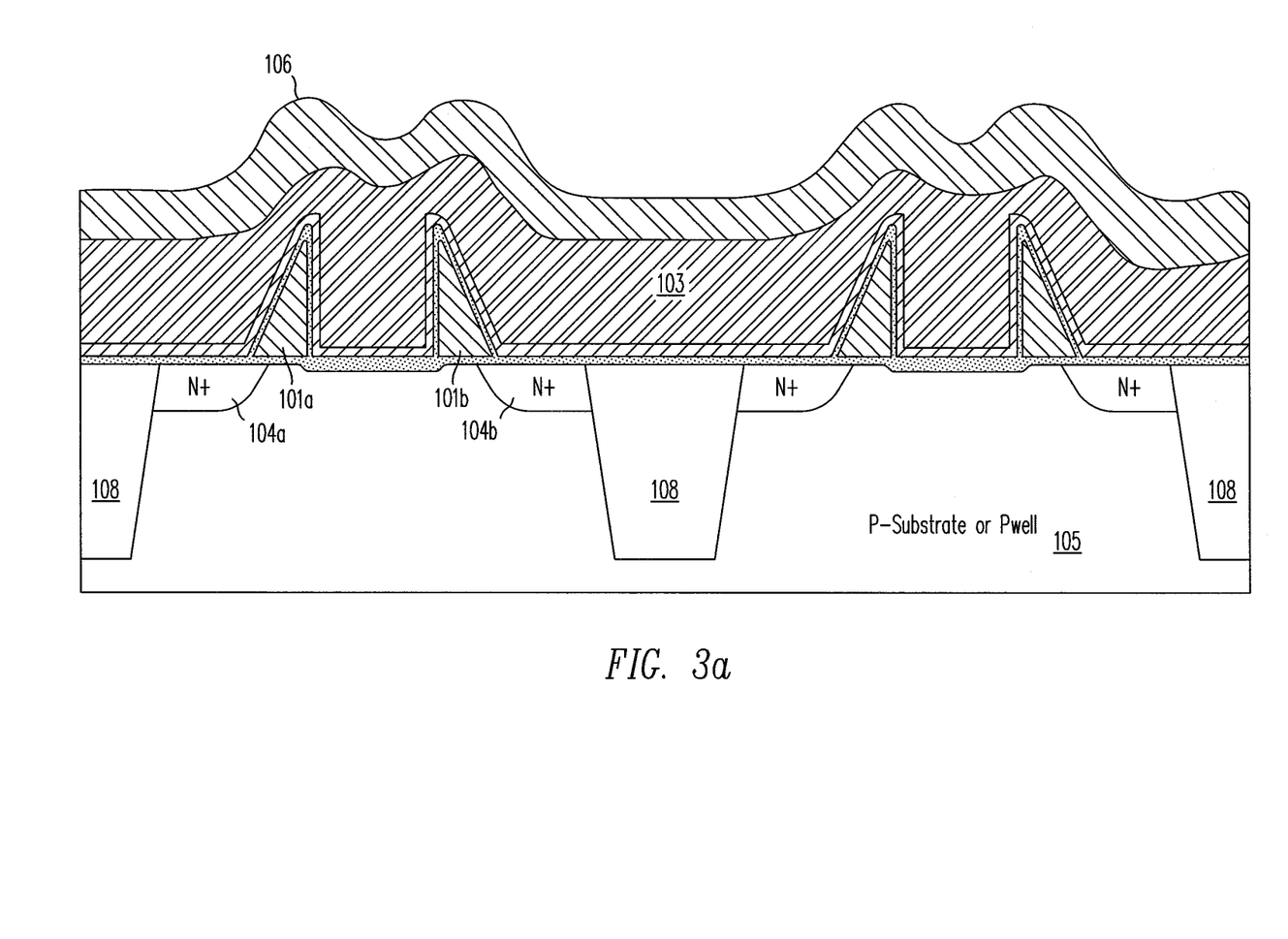
FIGS. 3(a) and 3(b) show cross-sections of dual conducting floating spacer NVM devices, for N-channel and P-channel devices, respectively, in NOR-type flash arrays, according to one embodiment of the present invention.
Figure 3B:
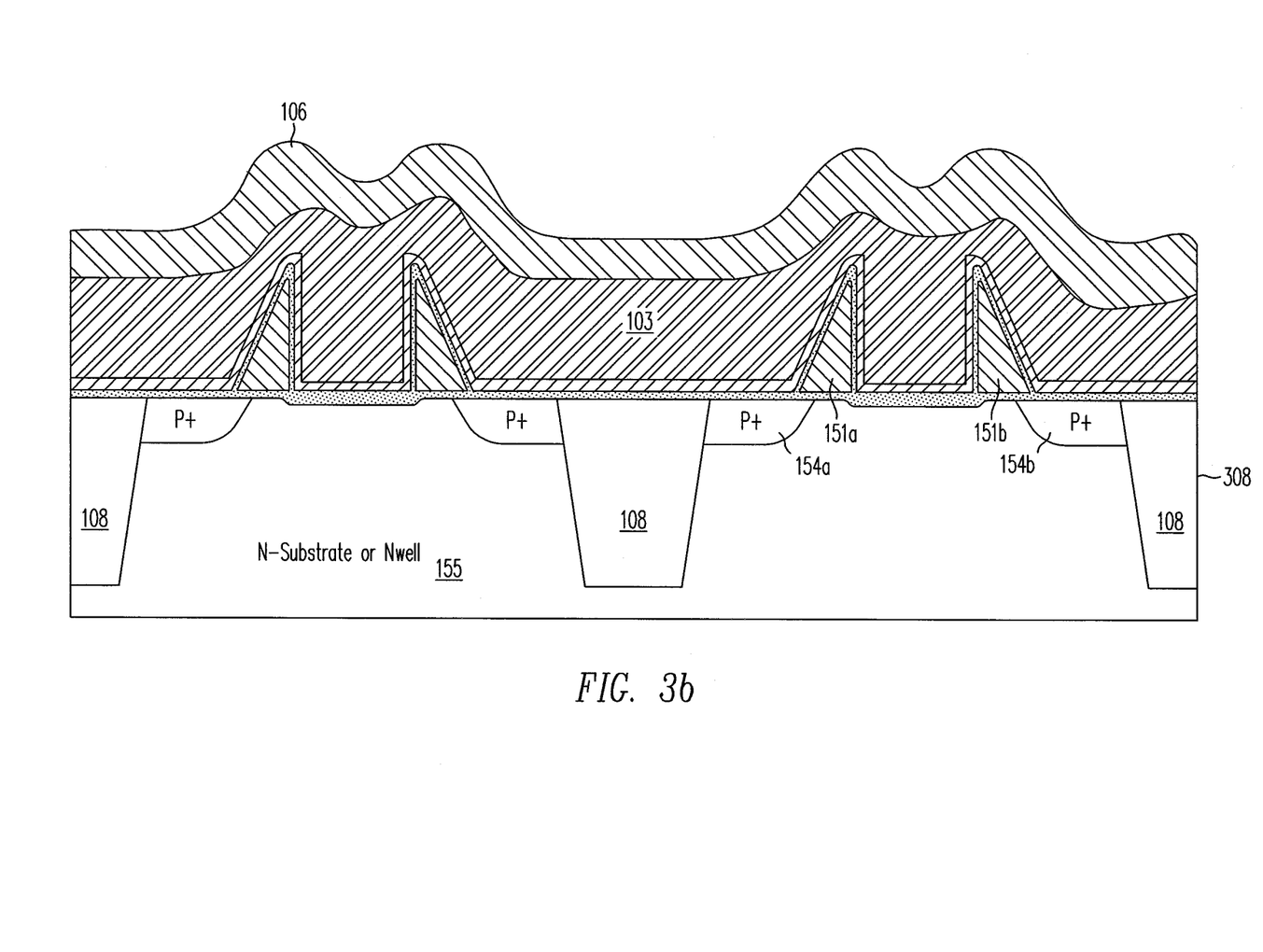
Figure 4:
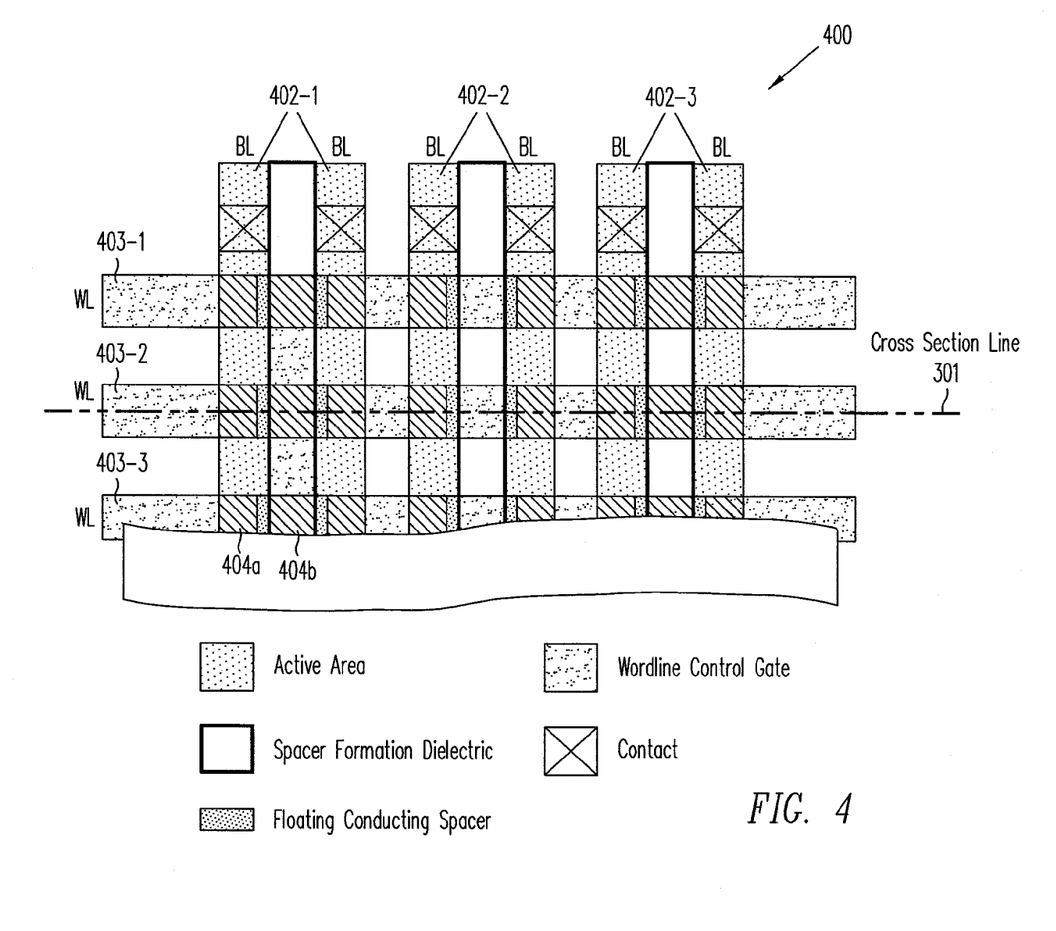
FIG. 4 is a layout view of NOR-type array 400 of DCFS devices, such as those shown in FIG. 3(a) or FIG. 3(b), in accordance with one embodiment of the present invention.

Similarly, FIGS. 3(a) and 3(b) show cross-sections of dual conducting floating spacer NVM devices, for N-channel and P-channel devices, respectively, in NOR-type flash arrays, according to one embodiment of the present invention. FIG. 4 is a layout view of NOR-type array 400 of DCFS devices, such as those shown in FIG. 3(a) or FIG. 3(b), in accordance with one embodiment of the present invention. The cross-sections of FIG. 3(a) and FIG. 3(b) may be seen from the cross section line 301, depending on whether N-channel or P-channel devices are fabricated.

Figure 6A:
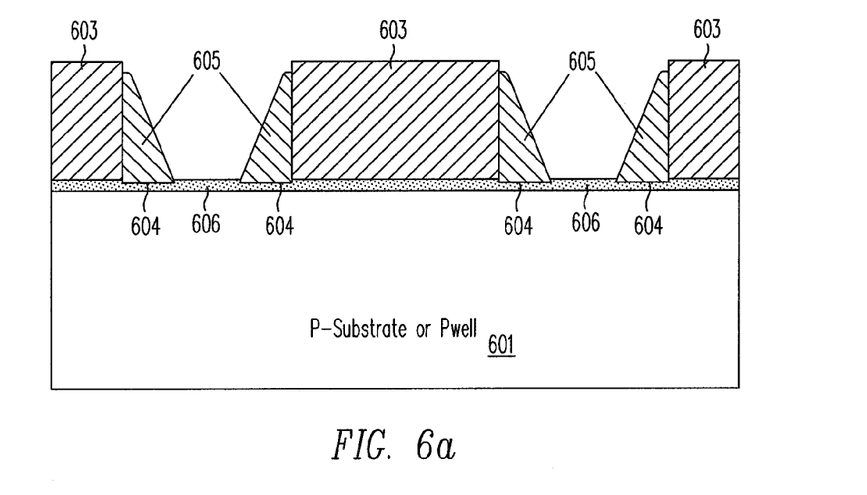
FIGS. 6(a)-6(d) shows intermediate structures attained under process flow 600, which illustrates a process for fabricating an N-channel DCFS MOSFET in an NAND-type NVM array, according to one embodiment of the present invention.

FIGS. 6(a)-6(d) shows intermediate structures attained under process flow 600, which illustrates a process for fabricating an N-channel DCFS MOSFET in an NAND-type NVM array, according to one embodiment of the present invention. As shown in FIG. 6(a), the DCFS MOSFET fabrication begins from a P-type silicon substrate 601 or a P-type well in an N-type substrate, using isolation modules and well impurity implant modules, as known in a conventional MOSFET fabrication process. A dielectric film (e.g., a 120 Å thick oxide/a 1500 Å nitride) is deposited and patterned in-between the word lines to form nitride strips 603. A tunneling oxide is grown, and a doped poly-silicon film is deposited and ion-etched to form the polycrystalline silicon spacers 605 along the side walls of nitride strips 603.

Figure 6B:
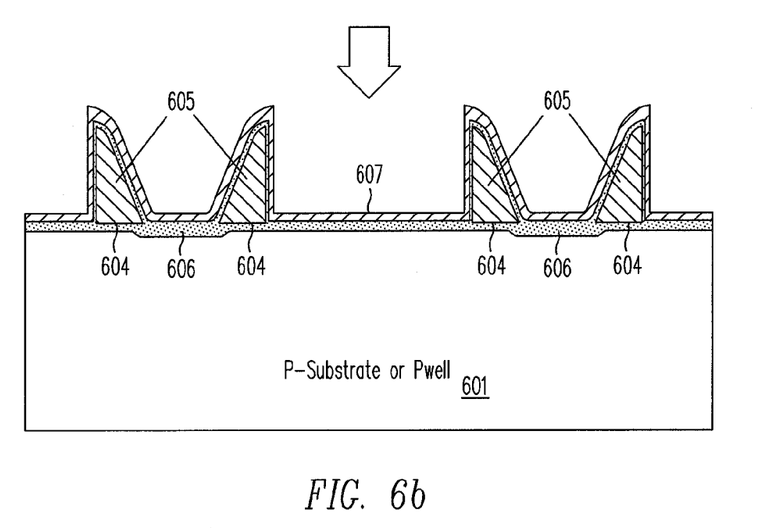

As shown in FIG. 6(b), nitride strips 603 are removed after poly-silicon spacers 605 are formed. The polysilicon spacers in the field areas inside the array area are removed by masking the bit line areas in a poly-silicon etching process. The remaining poly-silicon spacers inside the bit line areas are then re-oxidized in conjunction with a channel oxide growth process (channel oxide 606). Nitride and oxide films are deposited to form the Oxide-Nitride-Oxide (ON) stacks 607. ON0 stacks 607 are then stripped outside the memory array areas for regular MOSFET gate oxide growth.

Figure 6C:
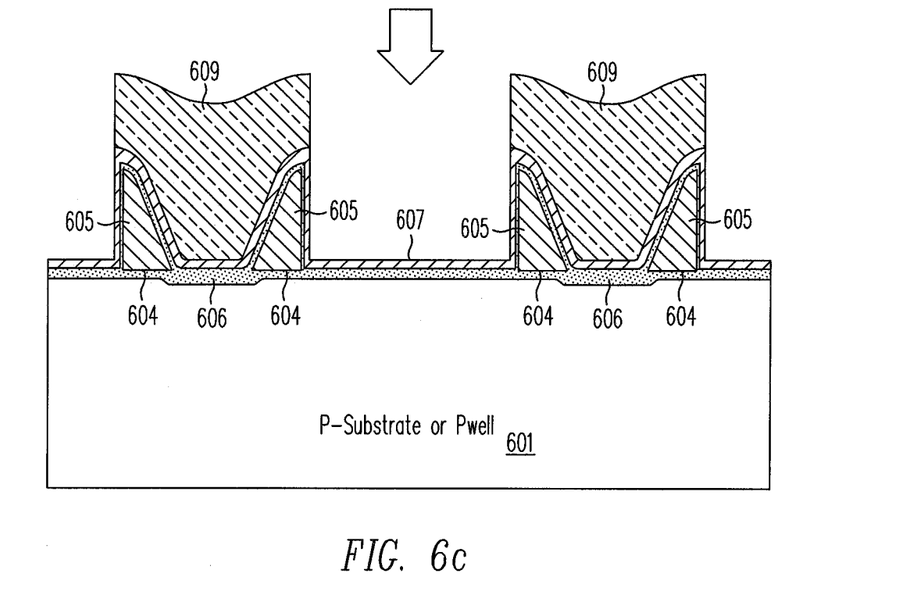

As shown in FIG. 6(c), a poly-crystalline silicon film 609 is deposited onto the wafer. Word line areas inside the NVM array are patterned and etched to form the array word lines (e.g., wordlines 612), which is followed by MOSFET gate pattern and etch process.

Figure 6D:
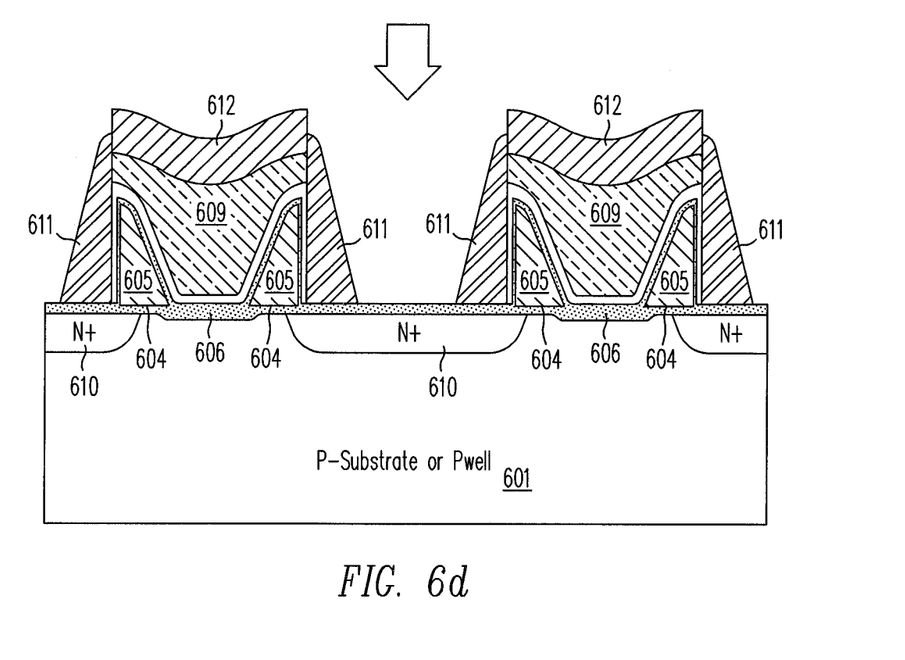

As shown in FIG. 6(d), an N-type impurity is implanted into the NVM array area to form source/drain diffusion regions 610 and lightly doped drain (LDD) implants are also performed into the regular MOSFET areas. Dielectric spacers 611 are then formed along word lines 612. Thereafter, heavy N-type and P-type impurities are implanted to form the source/drain electrodes for MOSFET. After thermal anneal, salicide formation, and metallization, such as known in a conventional MOSFET fabrication process, the fabrication of N-type DCFS MOSFETs in a NAND-type NVM array is complete.

Figure 7A:
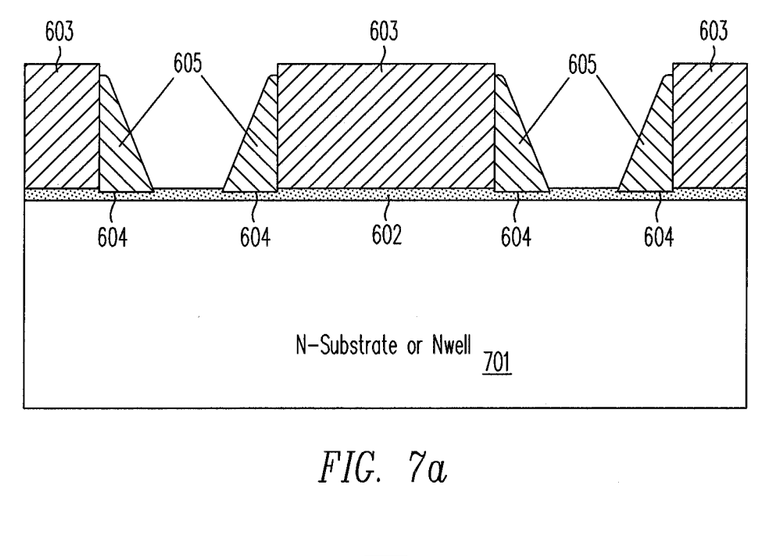
FIGS. 7(a)-7(d) shows intermediate structures attained under process flow 700, which illustrates a process for fabricating a P-channel DCFS MOSFET in an NAND-type NVM array, according to one embodiment of the present invention.
Figure 7B:
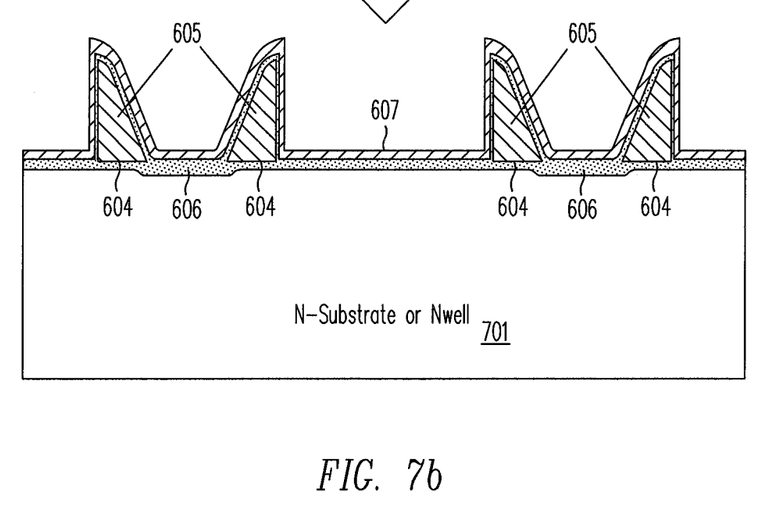
Figure 7C:
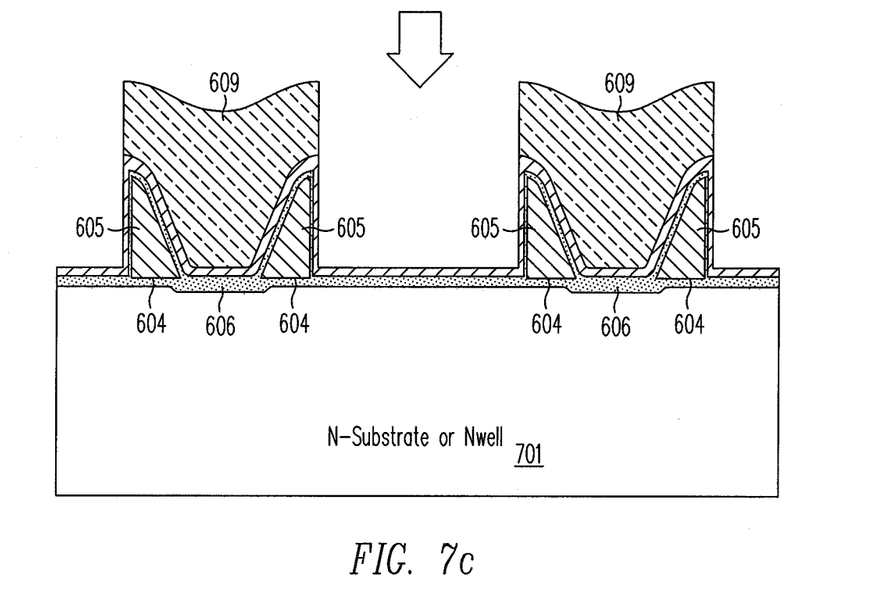
Figure 7D:
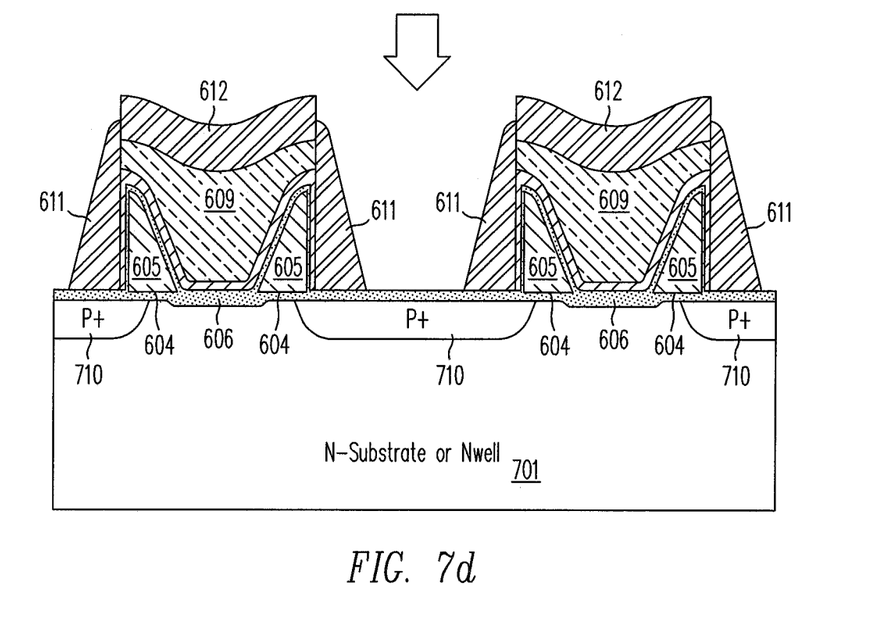

FIGS. 7(a)-7(d) shows intermediate structures attained under process flow 700, which illustrates a process for fabricating a P-channel DCFS MOSFET in an NAND-type NVM array, according to one embodiment of the present invention. As shown in FIG. 7(a), the DCFS MOSFET fabrication begins from an N-type silicon substrate 701 or a N-type well in an P-type substrate, using isolation modules and well impurity implant modules, as known in a conventional MOSFET fabrication process. The P-type DCFS MOSFET may be formed using substantially the same process as the process described above in conjunction with FIGS. 6(a)-6(d) for forming N-type DCFS MOSEFTs (NVM); except that, instead of N-type impurities used for source/drain formation in N-type DCFS MOSFETs, the P-type DCFS MOSFETs are formed using P-type impurities to form the source/drain diffusion regions.

Figure 8A:
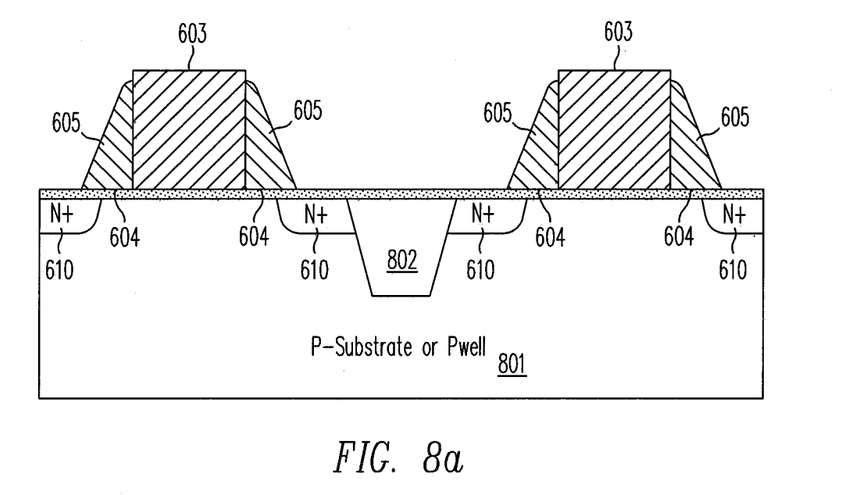
FIGS. 8(a)-8(d) show intermediate structures attain under process flow 800 for forming N-type DCFS MOSFET for a NOR-type NVM array, in accordance with one embodiment of the present invention.

FIGS. 8(a)-8(d) show intermediate structures attained in process flow 800 for forming N-type DCFS MOSFET for a NOR-type NVM array, in accordance with one embodiment of the present invention. As shown in FIG. 8(a), the N-type DCFS MOSET is processed in P-type silicon substrate 801, or a P-type well in an N-type substrate, using isolation modules and well impurity implant modules, as known in a conventional MOSFET fabrication. The isolation module provides trench isolation regions 802. A dielectric film (e.g., a 120 Å thick oxide/a 1500 Å nitride) is deposited and patterned to form nitride strips 603. A tunneling oxide is grown, and a doped poly-silicon film is deposited and ion-etched to form the polycrystalline silicon spacers 605 along the side walls of nitride strips 603. An N-type impurity is implanted into the NVM array area to form source/drain diffusion regions 610.

Figure 8B:
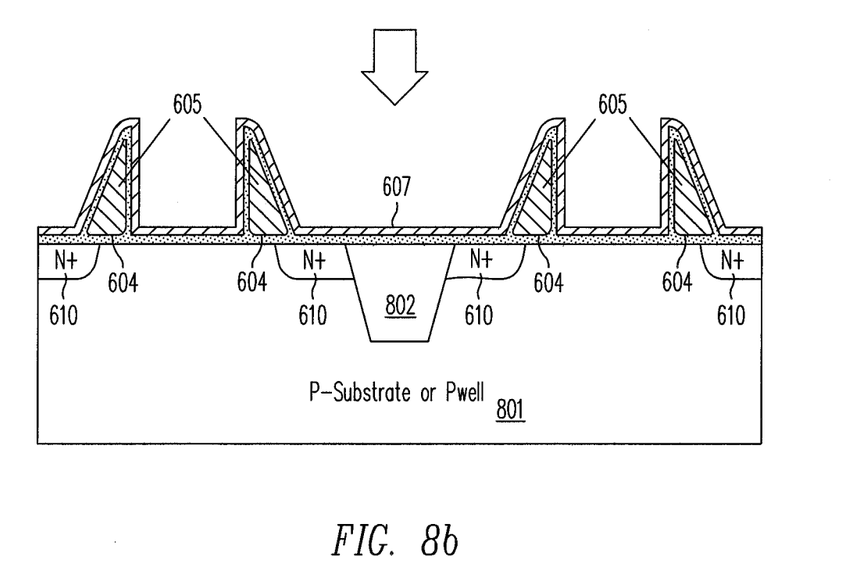

As shown in FIG. 8(b), nitride strips 603 are removed after source/drain regions 610 are formed. The polysilicon spacers in the field areas inside the array area are removed by masking the word line areas in a polysilicon etching process. The remaining polysilicon spacers are then re-oxidized in conjunction with a channel oxide growth process (channel oxide 606). Nitride and oxide films are deposited to form the Oxide-Nitride-Oxide (ONO) stacks 607. ON0 stacks 607 are then stripped outside the memory array areas for regular MOSFET gate oxide growth. A gate oxide may be grown in the regular MOSFET area.

Figure 8C:
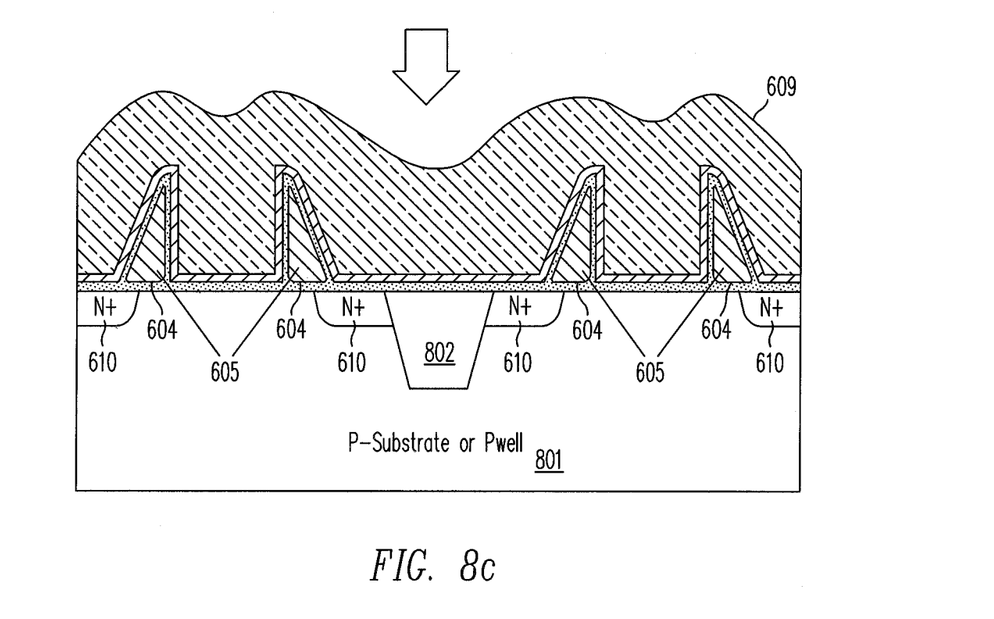

As shown in FIG. 8(c), a poly-crystalline silicon film 609 is deposited onto the wafer. Word line areas inside the NVM array are patterned and etched to form the array word lines (e.g., word line 612), which is followed by MOSFET gate pattern and etch process.

Figure 8D:
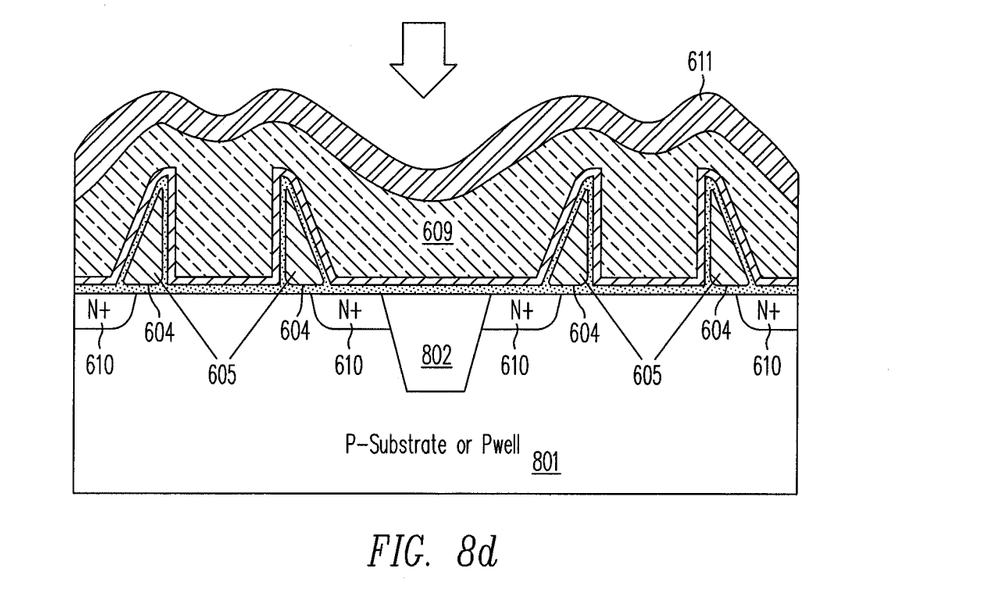

As shown in FIG. 8(d), and lightly doped drain (LDD) implants are also performed into the regular MOSFET areas. Dielectric spacers 611 are then formed over the word lines 612. Thereafter, heavy N-type and P-type impurities are implanted to form the source/drain electrodes for MOSFET. After thermal anneal, salicide formation, and metallization, such as known in a conventional MOSFET fabrication process, the fabrication of N-type DCFS MOSFETs in a NOR-type NVM array is complete.

Figure 9A:
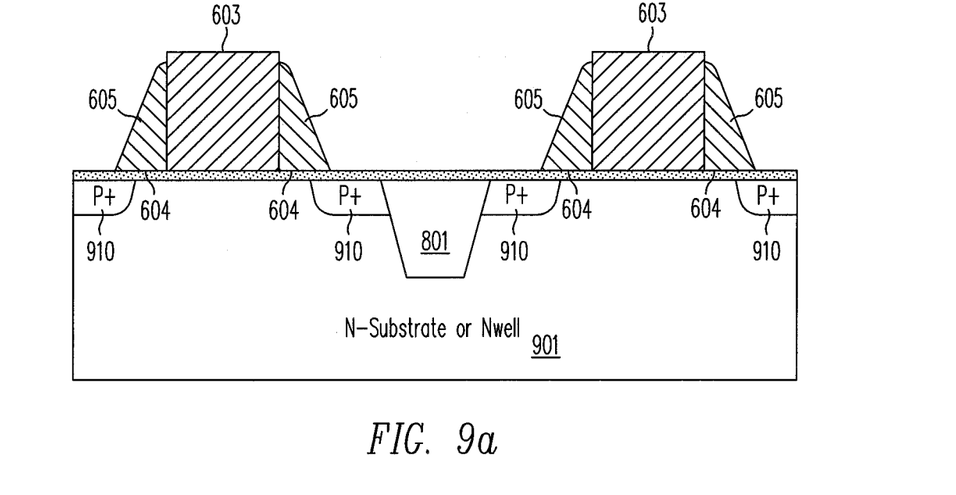
FIGS. 9(a)-9(d) illustrate an alternative embodiment of the present invention described in conjunction with FIGS. 7(a)-7(d).
Figure 9B:
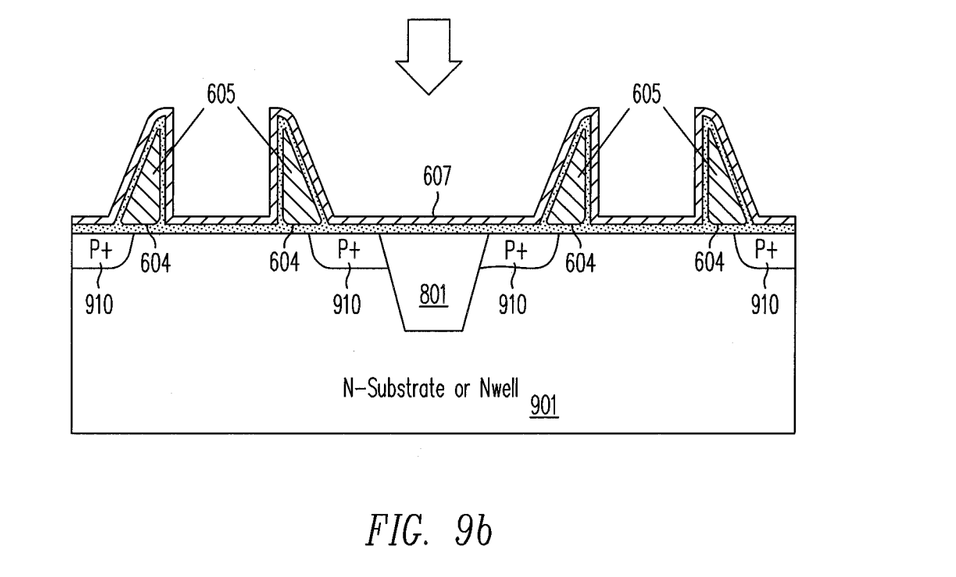
Figure 9C:
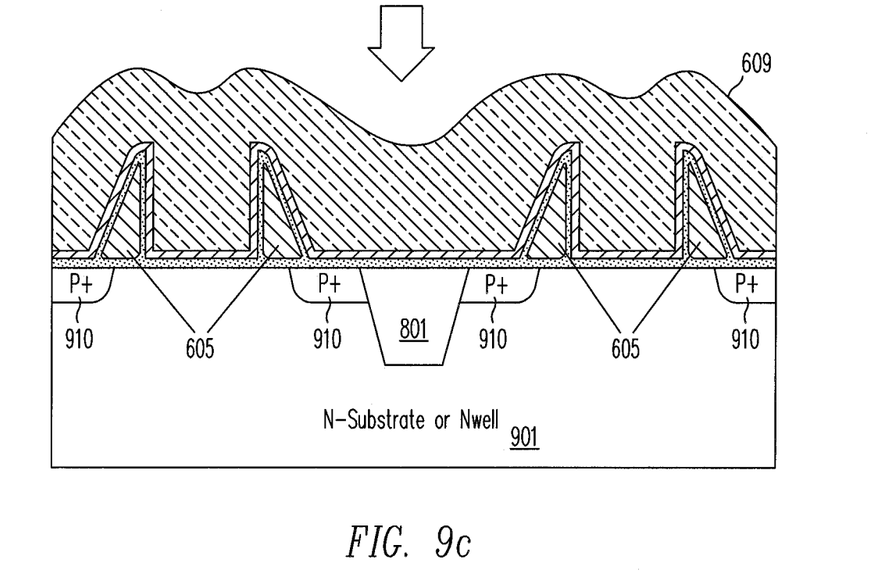
Figure 9D:
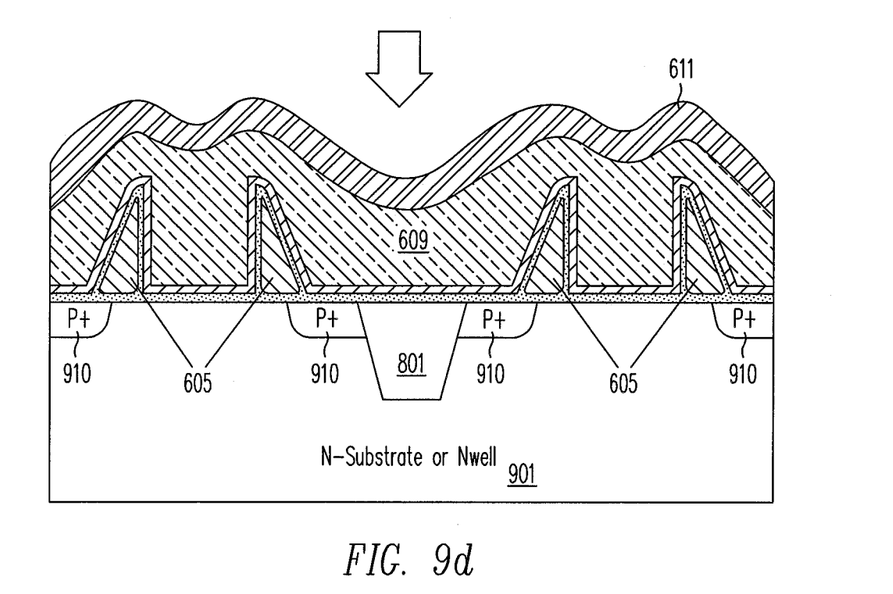

FIGS. 9(a)-9(d) shows intermediate structures attained under process flow 700, which illustrates a process for fabricating a P-channel DCFS MOSFET in a NOR-type NVM array, according to one embodiment of the present invention. As shown in FIG. 9(a), the DCFS MOSFET fabrication begins from an P-type silicon substrate 901 or a P-type well in an N-type substrate, using isolation modules and well impurity implant modules, as known in a conventional MOSFET fabrication process. The P-type DCFS MOSFET may be formed using substantially the same process as the process described above in conjunction with FIGS. 8(*a*)-8(*d*) for forming N-type DCFS MOSEFTs (NVM); except that, instead of N-type impurities used for source/drain formation in N-type DCFS MOSFETs, the P-type DCFS MOSFETs are formed using P-type impurities to form the source/drain diffusion regions.

The above detailed description is provided to illustrate specific embodiments of the present invention and is not intended to be limiting. Numerous modifications and variations within the scope of the present invention are possible. The present invention is set forth in the following claims.

I claim:

1. A dual conductive floating spacer memory cell, comprising:
    a semiconductor substrate having impurities of a first conductivity type, the semiconductor substrate having a first surface at which is formed a first source/drain region, a second source/drain region and a channel region between the first source/drain region and the second source/drain region, each of the first and second source/drain region having impurities of a second conductivity type;
    a control gate formed above the channel region, electrically isolated therefrom by a gate dielectric layer;
    a first conductive floating spacer and a second conductive floating spacer each having a first side and a second side, each conductive floating spacer being formed adjacent the control gate on the first side and each being electrically isolated by a dielectric layer from the control gate, such that the control gate and the dielectric layer form a substantially vertical sidewall on the second side of each of the first and second conductive floating spacers, the first and second conductive floating spacers being formed above the channel region and overlapping the first and second source/drain regions, respectively, each separated therefrom by a tunnel oxide region; and
    dielectric spacers formed along the substantially vertical sidewalls.

2. A dual conductive floating spacer memory cell as in claim 1, further comprising trench isolation regions in the semiconductor substrate.

3. A dual conductive floating spacer memory cell as in claim 1, wherein the first conductivity type is P-type and the second conductivity type is N-type.

4. A dual conductive floating spacer memory cell as in claim 1, wherein the first conductivity type is N-type and the second conductivity type is P-type.

5. A dual conductive floating spacer memory cell as in claim 1, wherein the dual conductive floating spacer memory cell is formed in a NAND-type non-volatile memory array.

6. A dual conductive floating spacer memory cell as in claim 1, wherein the dual conductive floating spacer memory cell is formed in a NOR-type non-volatile memory array.

* * * * *